(12) United States Patent
Ykema

(10) Patent No.: US 7,076,592 B1
(45) Date of Patent: Jul. 11, 2006

(54) POWER NODE CONTROL CENTER

(75) Inventor: John I. Ykema, Media, PA (US)

(73) Assignee: SPD Technologies Inc., Philadelphia, PA (US)

(*) Notice: Subject to any disclaimer, the term of this patent is extended or adjusted under 35 U.S.C. 154(b) by 0 days.

(21) Appl. No.: 09/213,099

(22) Filed: Dec. 17, 1998

(51) Int. Cl.
G06F 13/14 (2006.01)
G05D 3/12 (2006.01)

(52) U.S. Cl. ..................... 710/305; 700/286
(58) Field of Classification Search ............. 710/100, 710/305; 700/286; 361/788, 796
See application file for complete search history.

(56) References Cited

U.S. PATENT DOCUMENTS

| | | | | |
|---|---|---|---|---|
| 4,335,437 A | 6/1982 | Wilson et al. | ............... | 364/492 |
| 4,357,665 A | 11/1982 | Korff | ..................... | 364/492 |
| 4,477,862 A * | 10/1984 | Gonzales | ................... | 361/686 |
| 4,511,981 A | 4/1985 | Andow et al. | ............. | 364/492 |
| 4,771,185 A | 9/1988 | Feron et al. | ................ | 364/492 |
| 4,777,607 A | 10/1988 | Maury et al. | .............. | 364/492 |
| 4,819,180 A | 4/1989 | Hedman et al. | ............ | 364/492 |
| 4,985,845 A | 1/1991 | Gotz et al. | .................. | 364/492 |
| 5,231,565 A | 7/1993 | Bilas et al. | ................. | 364/492 |
| 5,237,511 A | 8/1993 | Caird et al. | ................ | 364/492 |
| 5,251,157 A | 10/1993 | Prather | | |
| 5,323,307 A | 6/1994 | Wolf et al. | | |
| 5,373,411 A | 12/1994 | Grass et al. | ................ | 364/492 |
| 5,390,081 A * | 2/1995 | St. Pierre | ................... | 361/775 |
| 5,414,640 A | 5/1995 | Seem | ........................ | 364/492 |
| 5,436,510 A | 7/1995 | Gilbert | ...................... | 364/492 |
| 6,351,715 B1 * | 2/2002 | Ykema | ....................... | 702/62 |
| 6,377,874 B1 * | 4/2002 | Ykema | ...................... | 700/286 |

FOREIGN PATENT DOCUMENTS

WO   WO97/14206   * 10/1996

* cited by examiner

*Primary Examiner*—Tim Vo
(74) *Attorney, Agent, or Firm*—Charles N. Quinn

(57) ABSTRACT

An electrical modular power node comprising a power bus backplane containing a plurality of bus bars, at least some of which are connectable to at least one power source, each bus bar having a plurality of terminals at regular intervals along the bus bar, each terminal being in a standard position in a pattern with terminals from the other bus bars and all terminal patterns being in a standard orientation on the backplane, and a plurality of functional modules, each housing circuitry having at least one connector for a connection to at least one terminal on one of the bus bars.

62 Claims, 9 Drawing Sheets

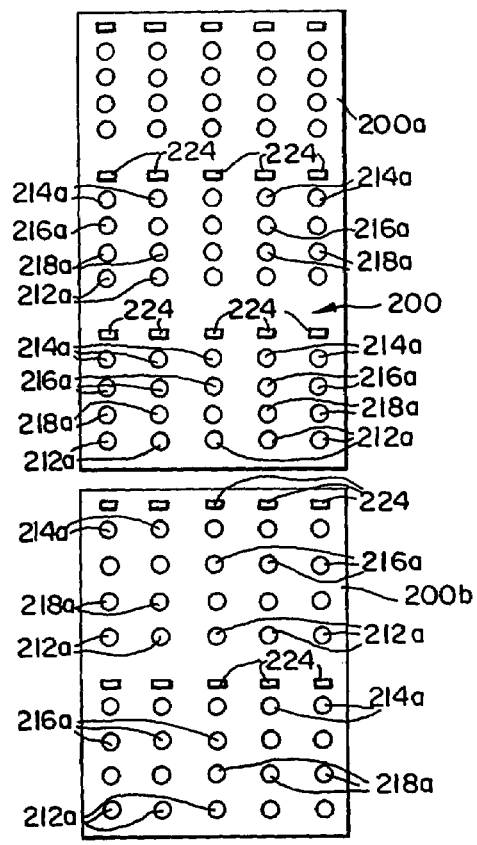
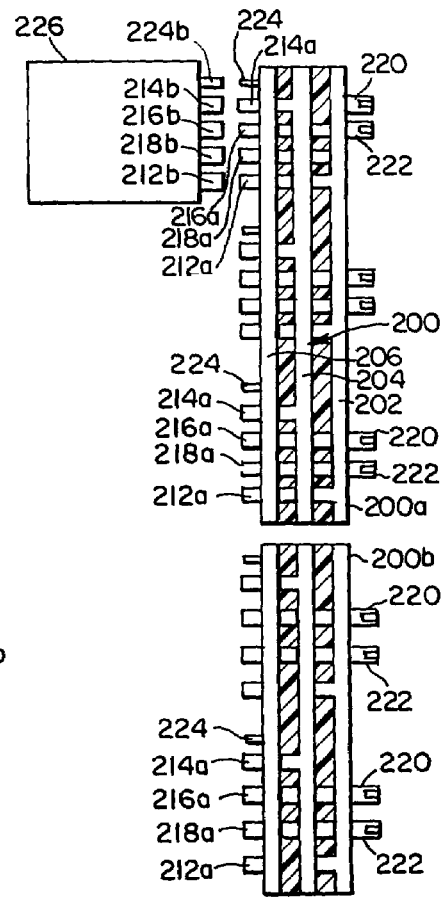
FIG. 9
FIG. 10
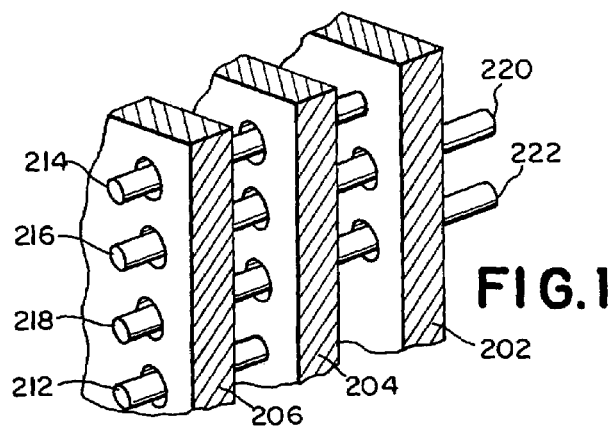
FIG. 11

POWER NODE CONTROL CENTER

FIELD OF THE INVENTION

This invention relates to power distribution systems and to methods and apparatus for controlling and protecting such power distribution systems, with emphasis on power distribution systems used in both military and commercial nautical applications and large land transportation vehicles.

DESCRIPTION OF PRIOR ART

Electrical power distribution systems normally include power sources and many loads, with loads connected to the sources by branches. Power from a source is frequently processed in some way, and possibly various ways, before it is provided to each of the various loads. The locations of circuit elements for processing power may be called "nodes".

Typically, nodes have been custom-tailored to fit a particular need of the electrical power distribution system at a particular location. One type of node is a power panel.

Power systems may generally be characterized as low voltage or high voltage power systems. For purposes herein low voltage power systems are considered to be power systems in which voltage is less than about 1,000 volts.

In low voltage power systems, nodes may vary in power capacity from less than 10 kilowatts to over 5 megawatts. Node functions vary from simple to very complex distribution. Automatic switching, frequency conversion, voltage conversion, power quality regulation, various types of system protection control and multiple operating control functions are just a few of the possibilities which may be used alone or combined for the requirements of a particular load.

Current practice in designing electrical power distribution systems is to identify functional and characteristic requirements for each node. Node functional requirements establish the kind, capacity and features of components and circuit elements, as well as the number of inputs and outputs to and from the node.

In current practice the designer identifies the type(s) of switching devices to be utilized at a node and the rating for each such device. The designer further identifies the type of control available to each node and whether such control should be automatic. Current practice is also for a power system designer to specify the type of protection, if any, to be provided at a given node.

In current practice it may be necessary to perform frequency and/or voltage conversion at nodes.

Typically, all of the equipment required to be present at a given node is not produced by a single component manufacturer, making it necessary to secure various components used at a node from different manufacturers. Conventionally, a producer may acquire and assemble many of the components and much of the equipment for each node and must design and custom engineer each node and its components before a desired output can be produced. As a result, each node typically takes on its own identity and is not thereafter easily changed. The power distribution system which eventually results loses flexibility early in the design process. Since lead time for purchase of node equipment includes the time required to design or custom engineer certain equipment to facilitate the functions to be performed at the node, changes in load requirements often result in long delays in procurement.

Conventionally, a power system node may contain several distinct elements which are not preassembled. In such case, it is necessary to install individual components at the node, connect those components into circuits after installation and then test the installed, connected components for proper operation.

SUMMARY OF THE INVENTION

This invention embraces electrical power distribution systems having a plurality of branches for carrying power to loads. The branches are interconnected at nodes at which various functional equipment and circuits are located for monitoring, switching, protecting and/or converting power to a form needed for one or more particular loads. Other needed functions may be conveniently performed in the nodes near the respective loads.

In one of its aspects, this invention provides nodes which are modular in construction to facilitate accommodation of changes in load requirements and which may be easily upgraded in the event of load and system changes.

The nodes preferably include modules for performing functions such as switching, power conversion and/or power regulation. Each module preferably includes functional components and circuit elements needed to produce and/or control a predetermined output modified from the power supply and designed for its load. The modules may be enclosed in modular housings designed to fit together with other modules and with a backplane. The nodes are preferably provided by placing the functional components and circuitry within modules which conform to one another and preferably compactly nest together one against each other, with at least some of those modules being electrically connected to an essentially contiguous or adjoining backplane. The modules preferably mutually support each other in the node, preferably in part by having power interconnections to the backplane which are mechanically able to support the interconnected modules. The nodes may have incoming power modules which receive system power, modify that power in some way and provide the modified power as output to functional modules which, in turn, supply a load.

The modules may be made rectangular solid in shape to facilitate fitting of plural modules together to form a compact node.

Mutually conforming non-rectangular solid shapes capable of being fit together are also within the purview of the invention.

In addition to providing a compact node, fitting the modules closely together adds overall mechanical support and thermal stability to the node structure, whether or not there is lateral or vertical interconnection between adjoining modules.

The modules are preferably of standard dimensions such that large modules have at least one dimension twice or some other even multiple of the corresponding dimension of a smaller module. The modules may be enclosed in housings for cleanliness or may have rigid frames enabling them to fit together, leaving open one or more faces. The components, circuit elements, conductors and connectors which are enclosed in the module, including any circuit boards and connectors that enable modules to be connected to one another preferably by self-contained connectors, may be supported directly on the module frame, enclosure or other specially provided support structure. In some instances support for at least some module components may be only from the module connectors. Support is intended to keep the module structures free from mechanical obstruction which may effect operation, electrical short circuits, undesired magnetic effects and the like. The support may maintain a preferred operational orientation of a component in the design orientation of the module.

In yet another of its aspects, this invention provides a standardized backplane for each node to connect with at least one bus structure. Power is input to the bus structure. The backplane provides quick connection means for a variety of different types and sizes of modules configured with cooperating connectors to self-connect to the bus.

The backplane-contacting modules preferably connect together to define the modular power node control center. Each backplane-standardized bus structure preferably accommodates a variety of proportionally dimensioned modules, any one or more of which may be replaced by similar or different modules. One module may, for example, be replaced by two or more modules of smaller size. Outlines of suitable module positions may be displayed on the backplane connection surface to facilitate positioning and repositioning modules.

The backplane itself preferably has more than one input bus structure, for example AC and DC bus structures, in which case separate connectors are provided for the modules so that even the smallest size module in any of its positions has connections available. The backplane may provide an intermediate bus bar as well as an input bus bar. Instead of output of a module being fed to a load, it may be fed to an intermediate bus so that the modified form of power on that bus is provided to other modules or to loads, either directly or after further modification.

Alternatively, a backplane might include a plurality of additional bus bars for carrying modified electrical power supplied from other power sources.

The backplane may also provide outgoing terminals for conductors leading to loads. In at least one possible arrangement a self-engaging coupling to mate with modules like those connected to the various bus bars may extend to a different connector on the opposite side of the backplane from the modules to which the conductors leading to the load or to other modules may be connected.

A control module part of a node may include a central processing unit or other microprocessor which may be programmed to perform various control functions of other modules forming a part of the node. The control system incorporating such a central processor unit and sensing devices as required may be added to the node, at the node or remote from the node, connected to and treating each node to which it is connected separately. When present, such a control system monitors input power to the node and power of each output connection from the node, monitors the electrical system data of the node and commands at least one of the modular functional distribution devices. Such commands may disconnect a node output circuit from a load or may stop power flow to the connected output circuit.

The control system may utilize programmable means for performing such monitoring and commanding. Such a control module may also be connected to an overall electrical central control which, by input signal, may change the state of one or more of functional devices from a given state to an opposite state. A control system may also monitor the functional distribution devices and send a command to automatically alter the devices for self-correction, turning the device off or sending a warning signal to the central control system. Where a control system includes monitoring or sensing means, processing means process the sensed data according to a predetermined or adaptive algorithm and produce an output function which may command action, display information or record data.

The power node control center may perform many varied functions including, for example, switching, voltage conversion, frequency conversion and voltage regulation. Where the node includes a control system, it is particularly well suited to perform protection control functions such as over-current protection, ground current protection, over and under voltage protection, over and under frequency protection, differential current protection, phase current imbalance protection and open circuit protection. The control module performs one or more operating control functions including, but not limited to, state monitoring inputs and outputs, health monitoring of all functional power distribution devices, diagnostic monitoring of the control functions, communicating control information to a central control station or other power node control center(s), receiving and operating on information and commands from the central control station or other power node control centers, displaying information pertinent to the node, or to the system at the power node and/or at a central control center. In addition to displaying such control functions as may be desirable for proper operation of the power node control center or the system, the power node control center may be programmed to shut down adversely effected loads or to perform corrective action in components at appropriate modules in the node, or elsewhere in the system.

BRIEF DESCRIPTION OF THE DRAWINGS

FIG. 9 is a front elevation view of an alternative construction of a power bus backplane;

FIG. 10 is a schematic sectional view showing connections from each backplane bus of the power bus backplane of FIG. 9, showing the connectors on the front and back of the structure and a module in position for coupling connectors at the front; and FIG. 11 is a highly schematic diagrammatic representation of conductors connected to backplane buses and conductors extending through openings through the backplane bus of the type illustrated in FIGS. 9 and 10;

DESCRIPTION OF THE PREFERRED EMBODIMENTS AND BEST MODE KNOWN FOR PRACTICING THE INVENTION

Figure 1:
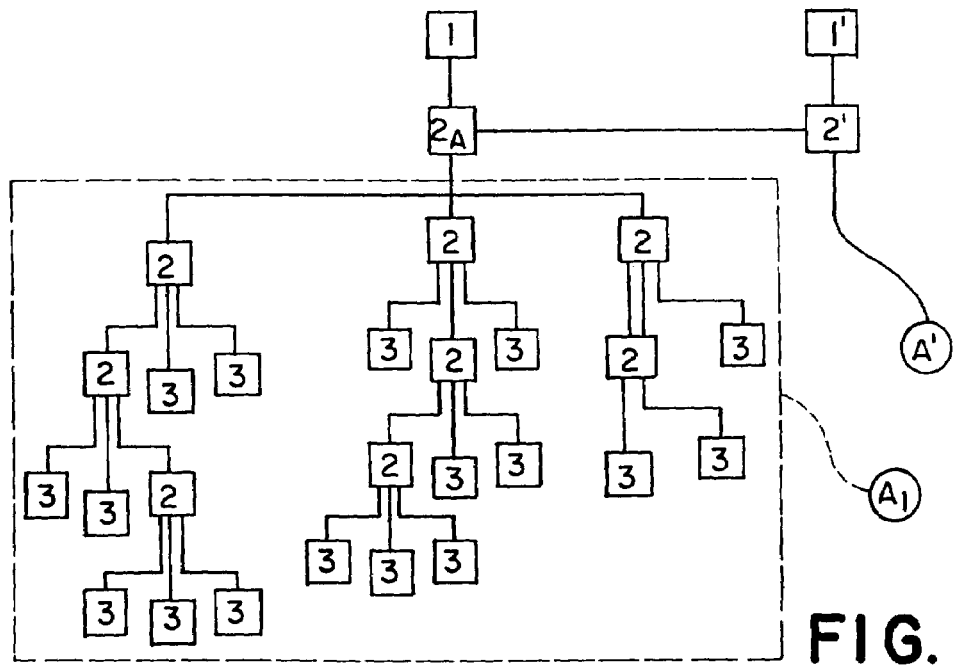
FIG. 1 is a schematic representation of a power distribution and delivery system including a plurality of power node control centers manifesting aspects of the invention.
Figure 8:
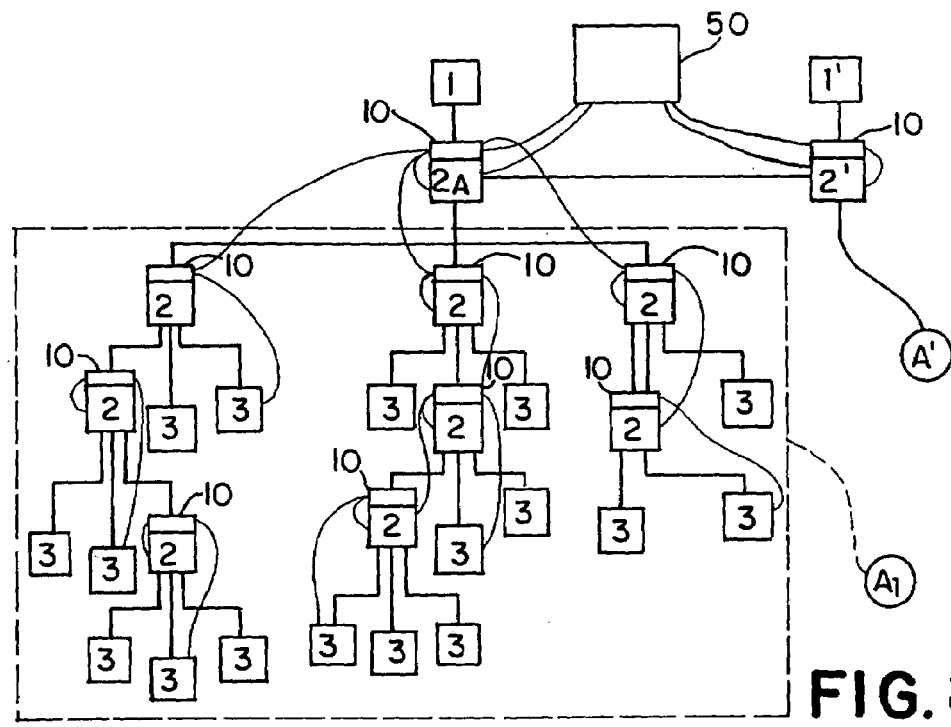
FIG. 8 is a schematic system drawing similar to FIG. 1 but with the addition of representative control modules and connectors thereto.

Referring to the drawings in general, and to FIG. 1 in particular, there is depicted a power distribution system manifesting aspects of the invention. The power distribution system includes at least one power source 1 and a plurality of loads, each of which is designated generally 3. The loads 3 receive power supplied by power sources 1 and perform various functions. Intermediate the power source(s) and the loads are a plurality of power nodes, each of which has been designated generally 2. Conductive branches carry electrical power supplied by sources 1 to selected nodes 2 for distribution by other branches to selected loads 3 or to further nodes 2, which in turn may feed selected loads 3 or even further nodes 2 associated with additional loads 3, etc.

Rectangular dashed line $A_1$ in FIG. 1 surrounds a plurality of nodes 2 and loads 3 fed primarily from one power source through a power node control center designated generally 2a and depicted schematically. The grouping of nodes 2 and loads 3 within rectangle $A_1$ may result from these nodes and loads having a common general location or a specialized function. Other groupings which can be expected in most systems are generally represented by a single grouping designated $A^1$, which will be in other locales of interest.

A' indicates schematically where a second group of nodes 2 and loads 3 may be connected to another control center 2' to receive power from another power source 1'. Other groups of nodes and loads and power sources may be added in many arrangements and are not necessarily limited to one power source per group, as is shown. The power sources may be networked together or directly through power node control centers $2_A$ and 2' as represented by showing power node control centers $2_A$ and 2' connected by branch 4.

There may be parallel different power sources, such as an AC and a DC source, located at a common position. The branch lines illustrated may therefore be more than a pair of conductors. Sets of conductors for different kinds of power in different locations may be encountered within one group.

Single lines in FIG. 1 indicate that there is electrical connection, or a fiber optic connection. In some cases the connection may be of a single type of power. If the power source is a DC source, two lines are required, particularly if a pair of bus bars for the DC are provided at each node. Single phase AC power at a particular voltage level also requires two conductors. If three phase AC is employed, three conductors are employed and a separate bus bar is used for each phase.

A power source may be a single source of power or it may be separate sources of power providing AC and DC with separate appropriate output conductors, probably a minimum of four, or five if the AC is three phase. An alternative possibility is that, if only AC is generated at the power source, an AC to DC converter is supplied at the control center $2_A$ to produce DC power with output branches representing both AC and DC conductors.

Some of the power node control centers $2_A$ and 2' have branch connections provided to the others, just as connection of the generated power from power source 1 is supplied to a network including the other power generators.

Power node control centers may actually provide more than one type of power; additional forms of power and levels of voltage may be provided at the power node control centers within the various groups according to the need of the loads they supply. Thus, one function of a power node control center may be to convert from one form of power to another. The individual modules of a selected power node control center may provide a converter such as a full wave rectifier with a smoothing circuit to obtain a DC output for selected loads from a single phase or three phase AC supply. AC may have its voltage changed by a transformer module or voltage limiting circuit, which might reduce voltage to a DC conversion module. Likewise, power frequency conversion can be accomplished in a frequency conversion module portion of a power node control center.

The power node control center depicted generally as 2a is of modular construction for use in the electrical power distribution system illustrated in FIG. 1. Power bus backplane 8 portion of the power distribution system has a plurality of preferably substantially co-planar bus bars for carrying electrical power. A plurality of the functional modules are each preferably contained in a parallelepiped-shaped housing adapted for complementally contacting fitting with other ones of the functional modules and with a backplane.

At least some of the functional modules include at least one of rectifying means, switching means, voltage conversion means, voltage regulation means, pulse and other wave form generation means, voltage transformation means and/or power sensing and limiting means.

A power node control center preferably further comprises a control module 10 contained in a parallelepiped-shaped housing adapted for complementally contacting fitting with at least one of the functional modules and with the backplane. The control module preferably further comprises programmable microprocessor means for controlling operation of at least one of the functional modules according to pre-selected instructions and operating and performance criteria including at least one of voltage and current limits, voltage polarity, surge criteria, temperature limits, humidity limits, shock limits and alternating current phase parameters.

Figure 7A:
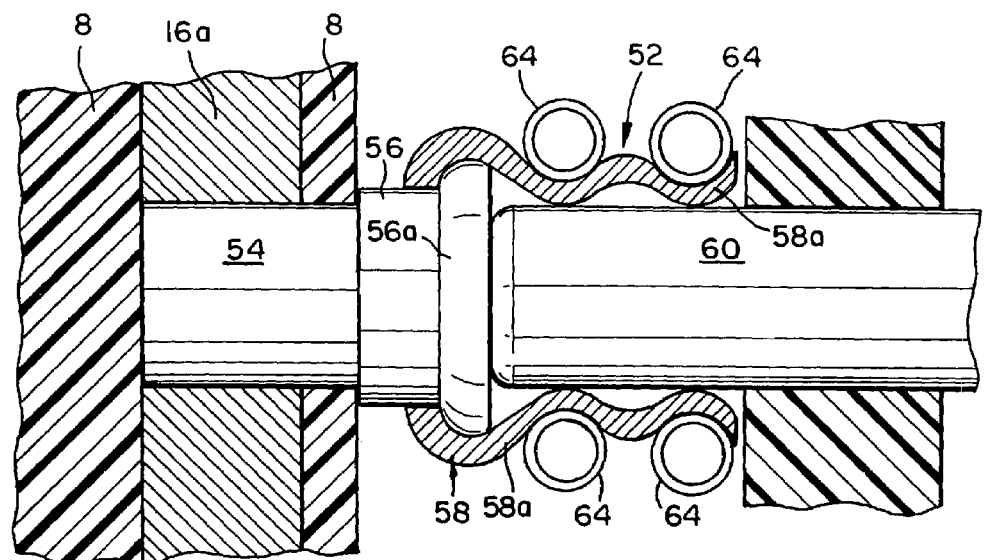
FIG. 7a is a much enlarged sectional view through a single pair of engaged coupling members.

The power node control center further preferably includes plug-compatible tulip and pin connecting means, as illustrated much enlarged in FIGS. 7A and 7 where the tulip is designated generally 52 and the pin is designated generally 54, on the backplane 8 and at least one of functional modules 6 respectively, for electrically connecting a selected functional module 6 to bus bars of backplane 8.

Figure 2:
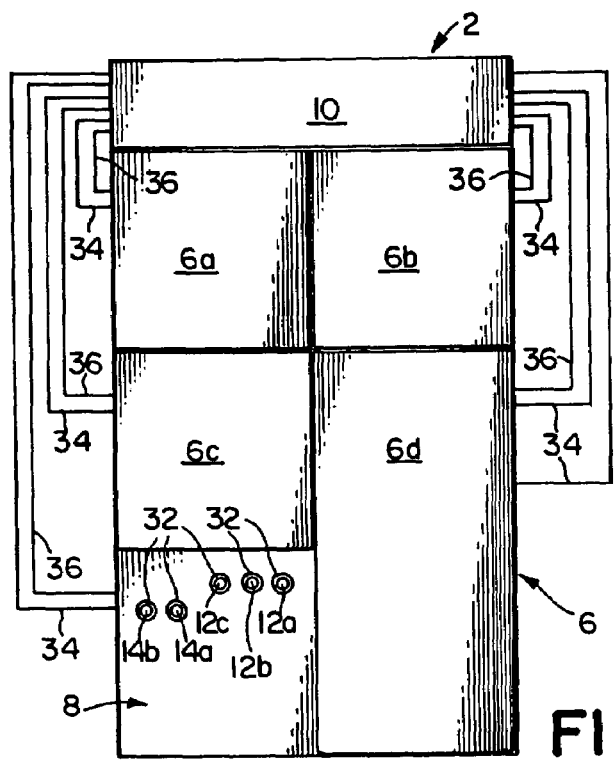
FIG. 2 is a front elevation in schematic form of a single power node control center with functional and control modules supported on a power backplane, exemplifying one possible configuration of power node control centers manifesting aspects of this invention.
Figure 3:
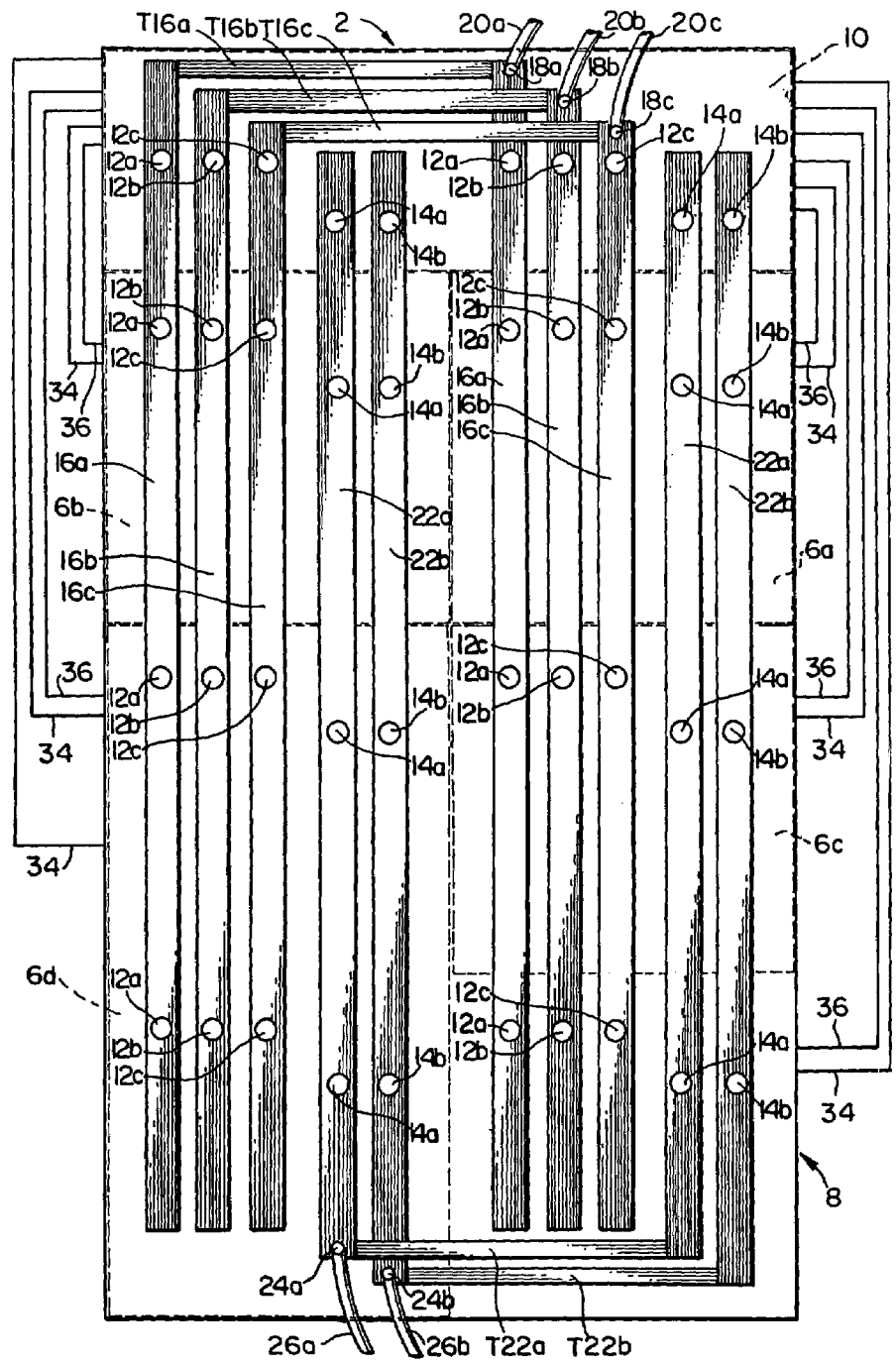
FIG. 3 is a rear elevation in schematic form of the power node control center depicted in FIG. 2 connected to a power bus backplane.
Figure 4:
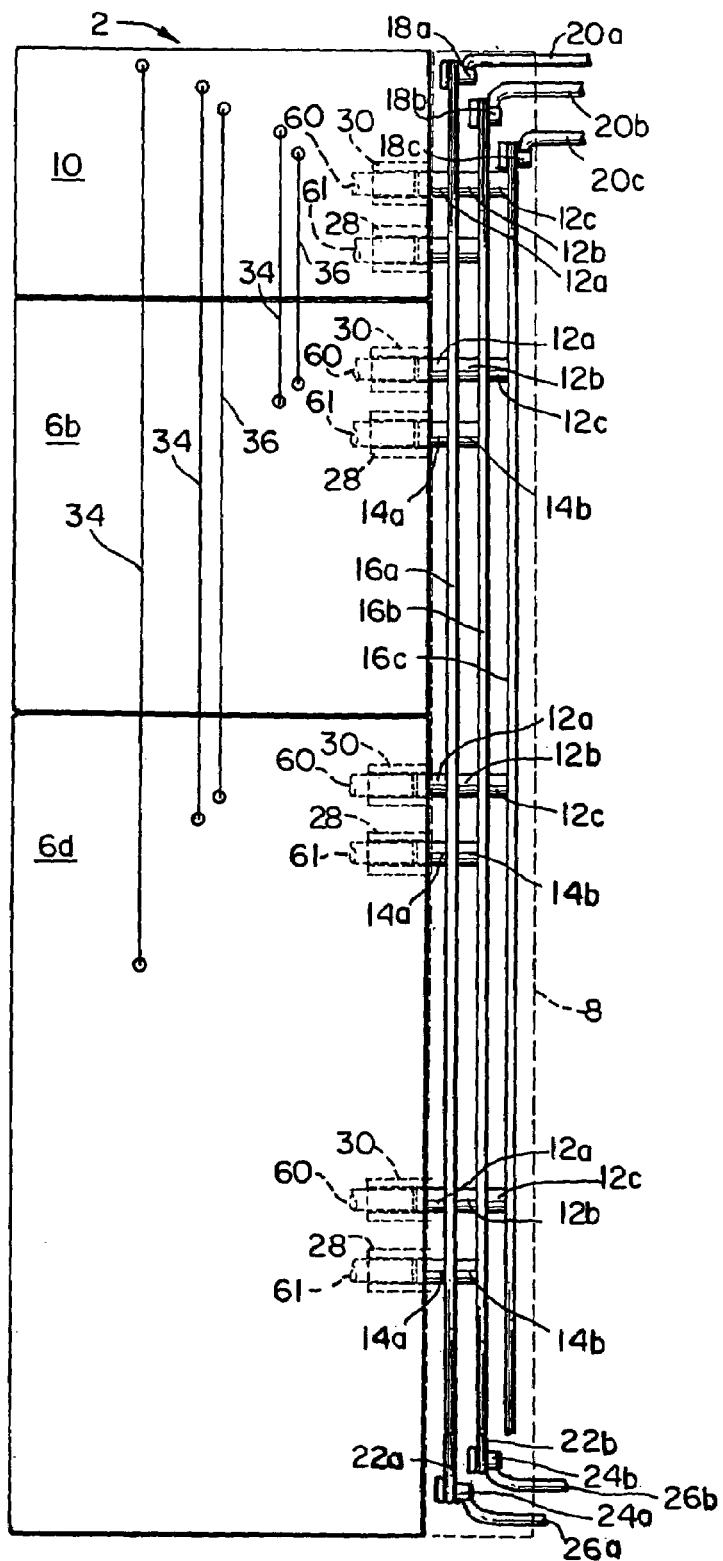
FIG. 4 is a side elevation in schematic form of the power node control center depicted FIGS. 2 and 3 taken looking from right to left in FIG. 2, showing the power bus backplane.

A modularly constructed version of a power node control center such as that designated 2a in FIG. 1 is illustrated in FIGS. 2, 3 and 4 showing front, back and side views of the same power node control center. Power node control center 2a is preferably electrically connected to three bus bars, 16a, 16b and 16c. In the case of three phase AC power, the bus bar for each phase is preferably connected to a separate power line carrying the designated phase. The power node control 20a, 20b and 20c center has a configuration of functional modules 6 cooperating with a power backplane 8. In this embodiment the power node control center 2a has four functional modules 6a, 6b, 6c and 6d clustered together. Conforming sides of the functional modules 6a, 6b, 6c and 6d allow the modules to nest together complementally providing mutual support for one another. Major mechanical support also comes from backplane 8 and specifically the connectors 12a, 12b and 12c and 14a and 14b, which are preferably repeated in the same relative positions and orientation for other modules and positions.

Backplane 8 preferably includes AC bus bars 16a, 16b and 16c respectively carrying A, B and C phases of three phase AC current. Since bus bars 16 run vertically and in the preferred embodiment illustrated there are two columnar functional module positions, bus bars 16 of the same phase are repeated in respective columns tied together by tying bus crossbars T16a, T16b and T16c. To prevent shorting, the bus and tie bars of each phase are positioned in different planes as illustrated in FIG. 4. Alternatively, the AC bus bars might be placed in the same plane and tie bars T16a, T16b and T16c looped over or under bars of other phases. Power input connections are preferably made at the end of the backplane 8 to the connection bars 16a, 16b and 16c respectively by connectors 18a, 18b and 18c and cables 20a, 20b and 20c.

Backplane 8 also preferably contains DC bus bars 22a and 22b, preferably repeated in two columns. DC bus bars 22a, 22b carry connectors 14a and 14b repeated at the same relative positions for each minimum sized functional module position. DC bus bars 22a, 22b are connected together by connecting tie bars T22a and T22b, at the opposite end of the backplane from AC tie bars T16a, T16b and T16c and preferably located in different planes to avoid shorting. Tie bars T22a, T22a conveniently provide connectors 24a and 24b for DC input cables 26a and 26b. A ring connector at the end of each cable is conductively held in place by a nut on a threaded terminal pin.

All of the input cables, both AC and DC, represent a single branch in FIG. 1. All of the input cables may be bundled together; alternatively, AC and DC cables may be separately bundled.

To provide proper support for individual modules through pins 12 and 14, the pins solidly connect to the associated bus bars which are constructed to be sturdy in order to bear applied loads. One preferable means of adequately supporting the bus bars relative to one another and properly spacing and insulating them from one another is to use an insulating potting compound, such as an epoxy resin or bakalite type resin, to give rigid support.

The bus bars when fully assembled are placed in a mold in proper relative position. A melted resin is poured into the mold and allowed to harden before the backplane is removed as a unit.

Preferably insulating material covers all of the bus bars including 16a and 22b and leaves only the connectors 12a, 12b, 12c, 14a and 14b projecting beyond the insulating surface.

The bars may alternatively be mechanically supported by a non-potted insulating structure.

FIGS. 3 and 4 illustrate the backplane structure with mechanical support omitted. As seen in FIG. 3, the support stem portions of the tulip connectors 12a, 12b, 12c and 14a and 14b are visible because they protrude through the backside of the bus bars; the flower parts of the tulip connector parts are not visible. The cylindrical pin stem portions are press fit, soldered or welded into conforming cylindrical holes in the bus bars. Therefore, it is the receiving ends of the tulip connectors that are seen in FIG. 3 rather than the ends which project toward and cooperate with the functional modules 6 or control modules 10.

Figure 5:
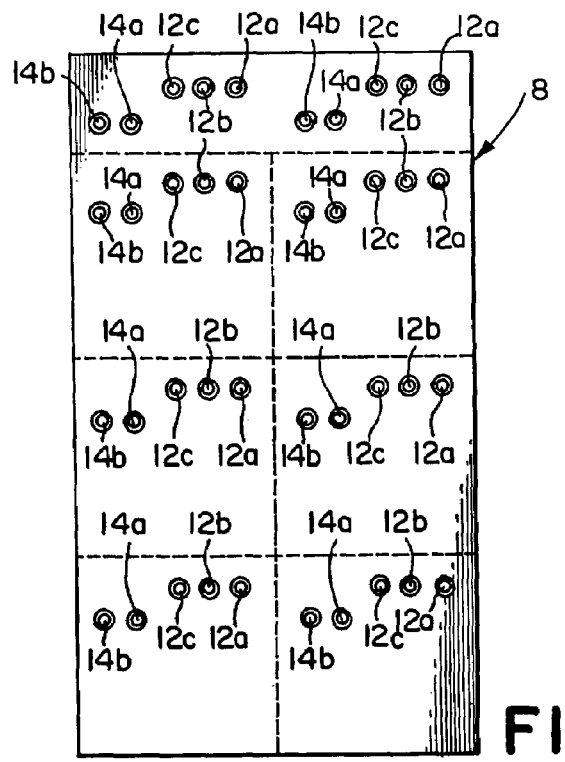
FIG. 5 is an elevation in schematic form of the backplane to illustrate points for connection of functional and control modules forming the power node control center with the backplane.

FIG. 5 shows the connectors on backplane 8.

The functional modules and the control module are preferably provided with pin connectors 60 to self-engage pin-receiving tulip connectors 52. FIG. 4 shows the pin connectors 12 and 14 on the modules as located in a cavity in the module housing wall, preferably a cylindrical cavity large enough to receive the tulip connectors 28 and 30 and permit them to engage the recessed pins 60 and 61 is employed. The purpose of recessing the pins on the modules is to permit the flat faces of the modules to contact the flat face of the backplane, thereby adding to the effective support of the modules.

In some cases, a module 6 and/or 10 may require only AC or only DC power. In such case not all connectors will provide electrical connection to that module. On the other hand, since connection of pins 60 with tulips 52 provides not only electrical connection but also mechanical support for modules 6 and/or 10, even where an active circuit is not connected it may be desirable to provide pin and tulip connector means or other types of connection means rigidly fixed to the module and capable of providing added mechanical support.

Where the alternating current provided is three phase and only a single phase is required, only two of the three conductors need be used for electrical connection; the remaining connectors are preferably used with their peripheries insulated to prevent short circuits and to provide added mechanical support. In order to isolate a single phase, a ground connection common to each of the phases may be required and may be supplied as a single common input to the node and a separate connection to the module which requires the ground.

A given module 6 and/or 10 may require all the types of power supplied by backplane 8.

If the module housing is a rigid structure and non-conductive at least in the area of the electrical terminals, the pin connector or some other type of terminal may be supported directly on the housing walls or a frame within the housing. Alternatively, pin connectors 60 may be mechanically connected to a component to which they are also electrically connected where power from those terminals is required. In such case the component supports the housing or may be connected to a frame or a wall supporting the housing. Examples of modules not needing electrical connectors in locations where they are not used for electrical connection are functional module 6d and control module 10 illustrated in FIGS. 2 through 6. Similar mechanical connectors, possibly made of non-conductive materials, are preferably provided on such modules in the non-electrically connecting positions for added mechanical support. As seen in FIGS. 2 and 4, module 6d is twice the height of the other modules.

In order to standardize backplane 8, functional modules 6 preferably only have integer multiples of the dimensions of the smallest permissible module at backplane 8. Module 6d may not require electrical connection except in one configuration, and possibly to only one set of connectors therein. Since connectors are provided in each minimum module position on the backplane, these extra connectors provide added mechanical support by providing extra non-conducting pins at corresponding locations not needed for electrical connection for the larger module. Having the connectors in place is desirable to facilitate accommodation of standardized modules and interchangbility of sizes through minimum size modules. Connection to both sets of connectors, 12a, 12b, 12c and 14a and 14b in each configuration using non-conducting pins in connection positions not needed for electrical connection of the module also provides added mechanical support.

As seen at the lower left of FIG. 2, at a given power node control center one or more modular positions may be unoccupied. In such event, tulip connectors 12a, 12b, 12c and 14a and 14b at that position are exposed. The connectors may be provided with insulated sleeves to prevent electrical shock and short circuiting. The pins providing power to a module are electrically conductive material to make good electrical contact between the pin and the circuitry within the module.

FIGS. 2, 3 and 4 show three AC bus bars and two DC bus bars preferably receiving power from a power source directly, or from a functional module. If the backplane 8 is standard and not to be changed, there is advantage to having backplane 8 fixed with active self-connectors in the standard positions corresponding to each module position. There are instances in which bus bars may need to be modified in various ways. For example, in some cases the parallel sets of bus bars may not be interconnected; each set may be capable of carrying different types or levels of power. What is shown as a single bus bar may be divided into two or more for various purposes.

The advantage of structure in which the connections are plug-in or quick-connect and of standard position on both the backplane and modules is significant. With such connections position and alignment of the modules relative to one another is automatically determined. To facilitate placing the modules in proper location it is an advantage to have minimum size module positions outlined on the backplane 8 by solid or dashed lines as seen in FIG. 5.

Figure 6:
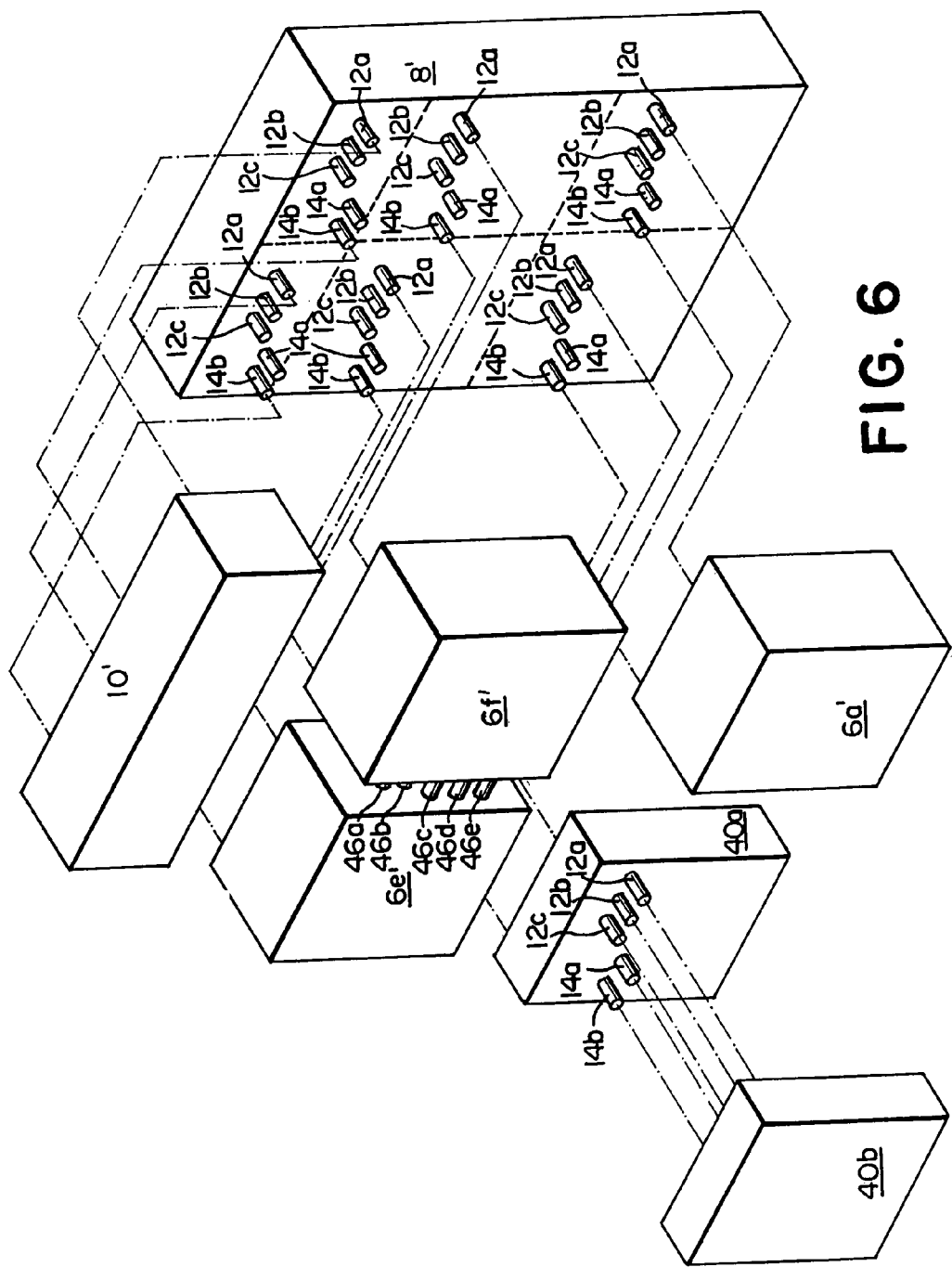
FIG. 6 is an exploded isometric schematic view of a power node control center and backplane similar to those illustrated in FIGS. 2 through 5.

The modules may have lateral connections which are also preferably plugged in or quick connecting as shown in FIG. 6 as between functional modules 6e and 6f. It might be that in a given instance, a power source would produce only one type of power, for example three phase AC power. In such event, at node 2a it might be desirable to convert AC to DC using a functional module containing a full wave rectifier and smoothing circuit. If the power node control center of FIGS. 2, 3 and 4 were involved, three phase AC power could be received in module 6a of FIGS. 2, 3 and 4 with that module containing full wave rectifier and smoothing circuits to provide DC power of a particular voltage level. The DC output might be either fed directly back to the DC bus bar or it might go for processing to functional module 6b for functions such as voltage regulation.

Alternatively, as seen in FIG. 6, lateral interconnection between functional modules 6e and 6f permits DC generated in module 6e to be fed to module 6f for use in producing a square wave or other non-DC power, to be fed back to the second set of bus bars to make that kind of power available for other modules within the node and/or to be passed on to other nodes.

FIG. 6 shows, in exploded perspective partially broken away but without showing internal detail of the modules, a slightly modified arrangement of power bus backplane 8', modules 6a, 6e and 6f, differently configured functional modules 40a and 40b and a control module 10'. The drawing shows, where possible, sets of connectors 12a, 12b, 12c and 14a and 14b in position to cooperate with functional modules 6a, 6e and 6f shown as minimum space modules. Pin connectors 12a, 12b and 12c, and 14a and 14b on the respective sets of three and two bus bars, occupy their positions so that the minimum space modules 6a, 6e and 6f fit precisely in place with the self-connecting terminals, which are not shown, included in the modules. The modules 6a, 6e and 6f and their connections to backplane 8 remain essentially the same. Modules 6a, 6e and 6f can be shifted around to provide the functional output desired to a given load. Of course, control module 10' cooperates with individual modules 6a, 6e and 6f and can be modified to control additional and/or different modules.

Module 6e is different from module 6a in that the module 6e provides self-connecting laterally directed pins 46a, 46b, 46c and 48a and 48b, similar to those of the backplane 8', for electrical connection as required and for mechanical support otherwise. The connections effectively provide output from module 6e to module 6f. These modules are connected together first before they are assembled to the back plane 8'.

An example of the function involved is a pulse generating unit in module 6e which generates a pulsed power output which might be placed on two bus bars through connectors 48a and 48b and their associated tulip connectors in module 6f. The connectors in module 6f are connected between a circuit to do pulse forming or limiting or some other function useful in that type of power. The modified power then is input back into the backplane by module 6f.

A protection and/or operating control module 10 or 10' is not necessarily included in every node. However, in many cases it is highly desirable to have protection and operating control module 10 right at the node. Such a module 10 normally receives its power from backplane 8. The node, of which it is a part, can also be interconnected with other nodes and/or with a central control center. Although control may not require a computer for each function, for many purposes the computer function is quite important. Although some of the functions may be done by non-computer controlled equipment, very often the same functions can be performed more efficiently and more compactly by the computer. Because of their small size, there may be separate chips and/or computer circuit boards for different functions within the same control module. Control and protection modules preferably permit interchange of circuit boards to change the nature of control and protect a functional module for example, or to appropriately control and/or protect newly substituted modules.

In addition to providing for change of the circuit boards, the control and protection module 10 or 10', while receiving power as needed for operation from backplane 8 through pin connections like those used for functional modules, connects to the functional modules normally via low current electronic connections which may be accomplished by jumper connections plugging into jack-like connections. As seen in FIG. 4, some of such of such functions may be one-way and may only require a single jumper connection 34; most will require bi-directional jumpers 34 and 36 to perform sensing and correction. Some modules may even require two or more sets for different types of sensing elements and correction signals.

The control systems included within the protection and/or operating control module 10 serve to monitor input power to the power node control center and output power of each output connection from the power node control center. They further preferably intelligently command at least one functional distribution device to disconnect the node output circuit or to stop power flow to the connected output circuit if an undesirable condition is detected on the output circuit.

In some instances a module whose output is monitored may have components capable of correcting the output in accordance with instructions from the control module in response to sensed information at the output or elsewhere in the functional component. One or more outputs from sensors within the functional module are provided from the various modules by electrical conductive or fiber optical connections or the like and may be bundled within harnesses with other conductors connected to the same functional modules. Such multiple conductor connections may use individual jacks or multiple connections at the control and function modules to keep the node less cluttered.

Many power distribution nodes of the invention preferably also include a control module 10, as illustrated schematically in FIGS. 2, 3 and 4. In the overall system some nodes may not need control modules.

Use of a power node control center lowers equipment and construction costs for multi-purpose uses on ships and used in other environments. The power node control center streamlines the power delivery system by combining functional modules to perform all of the functions required or desired at each node of the power delivery system.

Modules 6 can be standardized not only as to size and shape of the module packages but as to uniformity of position and types of connecting points. Such standardization reduces the number of functional modules 6 that will need to be stocked, tested and ready for immediate use for substitution or for replacement. All modules 6 can be factory-built and factory-tested ready for use in a standard node configuration. New nodes can easily be added as needed as well to accommodate new loads. Similarly, power sources and associated control centers can be added. Thus, the invention enhances the function of a power delivery system by assuring availability of the means to provide quality electric power to a large variable number of loads in the most efficient possible manner in a very short time with a minimum of disruption.

The power node control center of the invention provides for integration of power, protection, and functional control features within the node. Nodes with power modifying functions are accommodated with capacity to feed the modified power back into bus bars in the backplane, all in pre-packaged modular form. By providing functional modules packaged in affordable, standardized, scalable, easily operable and interconnectable modular upgradable structures, nodes may be placed near loads even in heavily used work areas to permit changes with a minimum of disruption of power service at the heart of a power delivery system. A great advantage to the system designer results from the open architecture of the power node control center power distribution backplane 8 with standardized power modules and programmable protection/control sub-systems utilizing microprocessors and software-driven peripheral elements to perform the control and monitoring functions, preferably close to each affected load.

The power node control center establishes a standardized family line which can be readily reconfigured to accommodate varying numbers of inputs and outputs along with a variety of power protection and control functions. Architecture of the power backplane, which itself may be made reconfigurable, provision of standardized functional power modules and creation of intelligent and programmable protection and operating control subsystems for any functional module, as embodied in the protection and operating control module, all lead to high efficiency and low cost for the power node control center. As a result multi-node power distribution systems can be fabricated using only power cables and standardized power node control centers, as illustrated in FIGS. 2 to 6.

Functional modules 6 may vary a great deal from one another. FIG. 5 shows an incoming module, which should become one of the more common modules in that the power from the source enters module 6e from backplane 8. Module 6e may be a regulated switching circuit, which may be opened or closed at an instant in time. The rate of switching is regulated by control module 10, using a sensed pulse frequency signal to regulate pulse width and interval in accordance with preset circuitry controls to adjust those parameters from a local control panel or from a central control panel, by adjusting circuitry in module 6e. The circuitry may be a switching circuit which acts in the open position to preclude power flow into module 6e, whereas in the closed switch position power flows into module 6e. Pulse amplitude may be sensed and adjusted to a fixed level at which it is maintained. The control circuit board or amplitude may be adjusted by controls at a panel board and circuitry at the modules used to regulate pulse amplitude.

Module 6f has a lateral panel carrying connectors which cooperate with pins 46a, 46b and/or 46c and with pins 48a and 48b. Having adjacent module side panels with a full set of connectors serves the same functions as with connection to the backplane. Standardization allows electrical connection by means of whichever available connectors are needed. Of course, it is possible to use modules with fewer standard connectors to supply just those needed for electrical connection. Module 6f may even be a dummy module just to allow connections most likely back to bus bar connectors 14a and 14b, since only two bus bars are needed.

Instead of using module 6f as a dummy for convenience in connection, it may divide functions if AC is employed. Under such circumstances, module 6e could be used to switch and module 6f to limit pulse amplitude to create a square wave applied through pins 14a and 14b to two bars 22a and 22b. Thus, module 6e may serve as an "output" module from, and module 6f as an "input" module to, power bus backplane 8'.

The power bus backplane 8', can be monitored so that the control module 10 might control function modules 6 in one of the following ways:

a) transfer switching where two incoming sources are available and it is desired to select from either source with the ability to transfer to the alternate source, for example, should the voltage level of the primary source fall below a prescribed level;
 b) inverting/switching to convert the frequency of voltage so that the output frequency provided on the bus structure is different from incoming line frequency;
 c) voltage transforming/switching to convert voltage such that the voltage level on the bus structure is different from voltage level on the incoming line; or
 d) any combination of these functions or other functions.

Under at least some of these situations power may be brought into the bars through a functional module rather than direct connection as shown in order to first perform the functions described. Similarly, other output power modules such as 6a perform various power functions, such as load switching, overload switching, switching for motor starting, frequency conversion, voltage transforming, or a combination of these functions depending on the needs of the load being supplied by the output circuits. As illustrated, these modules are preferably connected to and receive power energy from the power bus backplane 8'.

Central power node 2' may include an operator programmable protection and operating control module 10 in which programming may be done at the module, at the node or remotely.

In the protection function, module 10' may monitor the power system for anomalies and then instruct a functional module or modules 6 to take appropriate action to restore the power system to normal condition. The protection function preferably includes sensors which monitor various parameters of the power system within the node. The parameters may be current, voltage, frequency, temperature and/or vibration. The sensors preferably are incorporated within the functional module 6 or within the power bus backplane 8. The type of protection strategy employed depends on the power system, but may include current overload, power overload, power direction, phase current imbalance, differential current, over-voltage, under-voltage, over-frequency. According to the protection strategy, protection control module 10 issues appropriate instructions to one or more of the function modules 6 and/or to another power node control center, such as 2A or 2' in FIG. 1, or a central control station if the threshold level of any protection characteristic were exceeded.

In the operating control function, which is also performed by control module 10 or 10', preferably control module 10 or 10' monitors the system to assure that the power system is supplying the correct type of power to the loads selected by the operator. In performing the operating control function module 1.0 or 10' also preferably senses the power system parameters at the bus bar in the backplane 8 or 8'. The sensors are the same ones used for protection control plus others which sense the state of the functional modules, for example whether they are open (non-conducting) or closed (conducting). Control modules 10 or 10' also monitor the physical state of the node, that is whether functional modules 6 are connected to the power bus backplane 8 or 8' or are not effectively connected, as when only partially inserted into the connection but remain in a disconnected position. In performing the operating control function, module 10 or 10' may preferably be provided with a human interface to receive initial settings and operator instructions regarding the behavior or state of one of the functional modules 6 where needed. The operator could, through such operating control, instruct a control circuit breaker in a functional module 6 to close or begin conducting.

Operating control at each control module 10 may also monitor and act upon or gather and store data regarding the condition of the power system at the node.

The power bus backplane 8 or 8' preferably is a bus structure constructed preferably of either copper or aluminum bus bars which may have several different configurations, e.g. rectangular bars, round tubes, round rods, channels, or triangular shaped bus. The power bus backplane 8 or 8' preferably is so-arranged that the functional modules connect directly to the power bus backplane. This bus structure contains connectors as shown whereby the connected modules "automatically" self-attach, and may even literally snap on to the power bus backplane in quick connect/disconnect fashion.

The backplane 8' may also connect to a submodule 40*a* to create a low power bus backplane in module 40*a* in order to supply low power to submodule 40*b*. Low power module 40*b* may have a variety of functions but operates at lower power. In this example the functional modules 40*a* and 40*b* are each half the thickness of a conventional module, as illustrated in FIG. 6.

The functional modules 6 which connect to the backplane 8 or to one another are commonly conventional electromechanical devices constructed to perform some conventional intended function. Some functional modules 6 may be switching modules, using conventional electromechanical switching devices with electrical contacts opened or closed manually, by mechanical mechanisms, or by electronic switching devices or other means, such as conducting polymers, or a combination thereof. As new affordable technologies become available for switching, they can also be accommodated. The switching devices are rated according to power capability, voltage and frequency as well as function. Switching devices, for example, cover no-load breaker disconnect, load breaker disconnects, fault current breaker disconnects, and transfer switch functions.

Power conversion modules preferably are power electronics for frequency conversion, commonly referred to as rectifiers or inverters, and magnetics for voltage conversion, commonly referred to as transformers. Power conversion modules are preferably constructed to fit into the same enclosures opening as power switching modules, thus allowing flexibility of function for the power node control center. Power conversion modules are preferably made in various power ratings according to voltage input/output and according to frequency input/output.

The control module 10 may include its own internal backplane to which various circuit boards or cards are inserted. Each circuit card preferably performs a control function, either protection or operating control. There are preferably a number of circuit cards for protection control, each of which coordinates functional modules having characteristics to accomplish control such as current overload, differential current, out of phase current, ground current, over/under voltage, over/under frequency, temperature or any other parameter found to be necessary for proper protection of the electrical system. These may be separate circuit cards, or one circuit card can process a multitude of functions.

Similarly, the operating control function is preferably on various circuit cards which are also inserted into the internal control backplane of control module 10 or 10'. These operating control circuit cards preferably perform the various control functions associated with the electrical system control and with equipment diagnostic control. There are preferably also circuit cards which control the communications with other power node control centers 2 and with the central power system control. The control function thus incorporates data processing and data storage capabilities. It also may have provisions for display or be connected to a separate display. These circuit cards may operate for analog and digital processing control.

The data sensing is preferably done via sensors located within the power modules or located within the load equipment being supplied from the power node control center 2. Data from different environments can also be obtained. All the sensors are preferably connected to the control backplane and their data are available to the circuit cards for processing, as each is instructed according to the demands of the operator or system designer. The sensors can be magnetic sensing devices, shunt devices, capacitor devices, fiber optic devices or any other type of sensor suitable for the application.

The power node control center 2 may be enclosed in a metal or plastic enclosure. There are different frames, that is, vertical sections, with each standard vertical section being capable of accepting or housing the proper vertical backplane that support the power modules for a particular power level. There are vertical frames rated for various power levels according to frequency and voltage and type of systems i.e. single phase or three phase. A family of frames are constructed according to power ratings. Frames may then be combined to form the desired power node control center for the electrical system application.

The frames, power modules and control modules are preferably standardized such that each is assigned a set of catalog numbers. This permits ordering a power node control center via a catalog number.

Figure 7B:
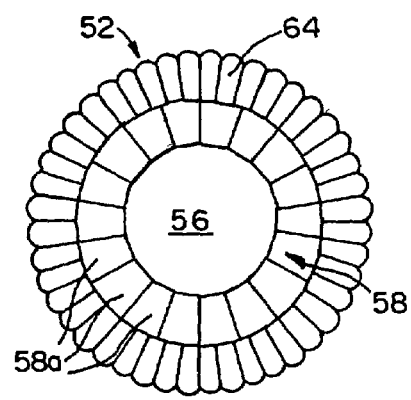
FIG. 7b is a vertical elevation looking into the tulip connector.

Functional modules 6a, 6b, 6c, 6d and control module 10 are inventoried items. The quick connect/disconnect feature between the modules 6 and/or 10 and the power bus backplane 8 permits rapid replacement of any of modules 6 and/or 10 upon failure thereof. A single enlarged coupling is seen in FIGS. 7a and 7b and intended to represent a preferred coupling. The backplane bus bars are provided with tulip connector couplings generally designated 52 which automatically engage and retain pins 54 on a module as the module is pushed against backplane 8 with the module pins 54 in proper alignment with associated tulip connector 52. The tulip connector 52 when pushed over a pin 54 mechanically engages and makes good electrical contact with pin 54 and hence makes good electrical connection with the supporting bar to which the tulip connector 52 is electrically and mechanically a part.

If the power bus backplane is attached to self-supporting structure such as a bulkhead on a ship, the power bus backplane in turn mechanically supports as well as electrically connects each control and/or functional module having such self-engaging contacts.

Each module in turn provides generally rigid mechanical support for tulip connectors 52 and hence is mechanically supported by backplane 8.

The modules engage the backplane and are supported thereby. By their conforming sidewalls engaging with and nesting with adjacent modules, further rigidity and support is added to the whole power node control center structure. The rigidity and nesting of modules in conformity with the faces of adjacent modules provides support for the whole power node control center, even if some modules are not connected to the backplane, provided those modules are positioned for support by, and perhaps connected with, adjoining modules.

FIG. 7a is an enlargement of an engaged tulip connector-pin combination. FIG. 7b is a view into tulip connector 54 from the open end. The self-engaging, self-releasing connector structure includes a generally cylindrical pin 514 preferably press fitted into a hole in bus bar 16. An intermediate mount 56 which of generally ring-like configuration is fixedly secured, typically by welding, to the end of cylindrical pin 54. The intermediate mount 56 includes a cylindrical collar-like portion to which pin 54 is secured and an enlarged annular lip portion 56a which extends radially outwardly beyond the periphery of the cylindrical portion as illustrated in FIG. 7a.

The tulip connector further includes individual petals 58 which are retained in position by annularly configured coil springs 64. Force provided by coil springs 64 urges petals 58 radially inwardly until those petals contact one another on lateral edges thereof as illustrated generally in FIG. 7b; such contact prevents the petals from collapsing inwardly and causes the petals to remain in a configuration such that an open center is provided into which a pin 60 may be inserted.

The cylindrical base 56b of the connector receptacle receives a larger diameter portion of sleeve 58 than the rest of the sleeve, which larger diameter portion may be but is not necessarily fixed as by welding, soldering or otherwise fixed in place to the base. The open end of the tulip flares outward and increases in diameter toward the lip.

The resulting large diameter opening allows the pin 60 to enter easily into tulip 58. The tulip is preferably constricted at two axial positions by annularly configured coil springs 64 which urge the tulip leaves radially inwardly toward the axis, to a diameter smaller than cylindrical pin 60. When cylindrical pin 60 engages tulip petals 58, the petals expand against the force of springs 64, and springs 64 hold petals 58 in good conductive contact with pin 60.

Force exerted by springs 64 firmly engages the tulip 52 with pin 60 so that in addition to good electrical contact, good mechanical support is provided.

A module base ultimately supports the circuitry and components and the module housing. The housing must be supported on the component structure or supporting frame work and must provide outwardly flaring openings to allow each of the conductive tulips 52 access to freely slide over its mating pin 60. Since multiple contacts are required, the module housing must also pattern the positions of tulip connectors 52 to correspond to pin 60 positions on the module of interest. Thus, when a module is ready, it is engaged by positioning pins 60 relative to associated tulips 52 on bus bars 16. Pushing the module against pins 60 causes tulips 52 to engage pins 60 automatically. When engaged, if the power bus backplane 8 is supported on a bulkhead or other solidly anchored self-supporting structure, pins 60 will support the modules through tulip connectors 52. Nesting of modules with one another adds support to the whole power node control center, including any modules not connected to power bus backplane 8. Removal of a module by reversing the process is also quite easy; replacement or substitution of modules can be readily accomplished.

Where necessary, as in the case of an exemplary low power module 40b such as shown in FIG. 6, connection internal of the power node control center, between modules 40a and 40b other than to power bus backplane 8, may be employed. Modules may also be electrically and mechanically connected laterally to one another through adjacent sidewalls, in a self-connecting manner such as described above, before being connected as a modular unit to the power bus backplane 8. Alternatively, modules may be connected internally of the power node control center or through outside surface connectors.

Figure 12:
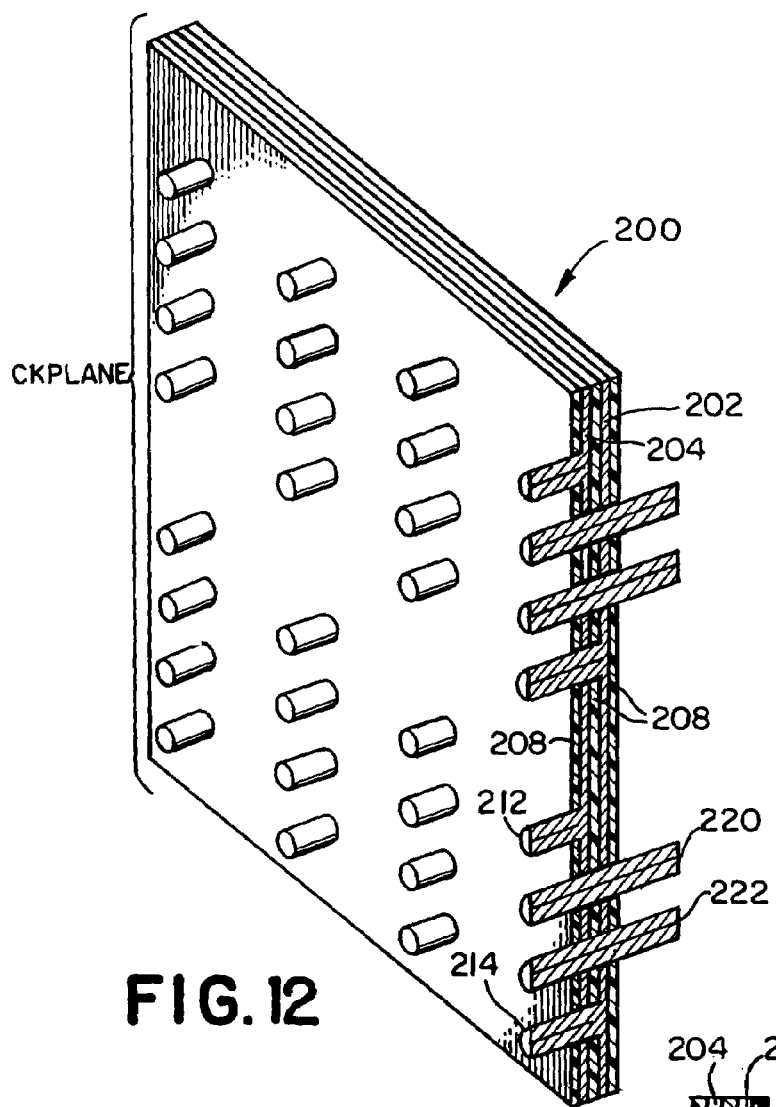
FIG. 12 is a schematic perspective view similar to FIG. 11 of a corner of the power bus backplane of FIGS. 9–11, but showing more of the structure with insulation in place and showing a section taken along a column of terminals.
Figure 13:
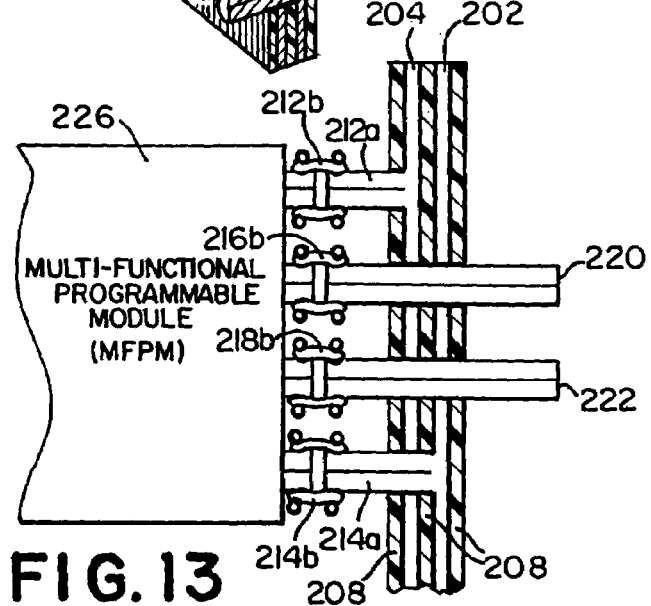
FIG. 13 is a schematic diagram similar to FIG. 10 but showing a somewhat enlarged single module coupled to a portion of the power bus backplane.

Referring to FIGS. 9 through 13 a different embodiment of a power bus backplane generally designated 200 is provided. The backplane may be made of parallel sheet conductors the size of the entire panel board. All of the drawings are schematic and FIGS. 12 and 13 show only the negative bus sheet 202 and the positive bus sheet 204. FIGS. 9, 10 and 11 show those bus sheets plus a control bus sheet 206 for carrying control signals much as a computer bus does. A control bus may not be supplied in each instance but offers an alternative to jumpers. The bus sheets may be broken into parallel bars which may or may not be interconnected. It is preferable to provide insulation 208 covering the front and back and edges as well as between the bus sheets. The backplane may be made by potting the bus sheets or bars and their various connections in a suitable resinous material that may be poured in liquid form and hardened so that the module as a whole is a single unitary structure encased in insulation.

As seen in FIG. 13, the connectors are again preferably tulip connectors but located on the modules to connect to pins on the backplane.

FIG. 11 is a schematic drawing intended to show connectors to and through the bus backplane. The drawing shows the conductors as uninsulated primarily to emphasize the fact that conductors which are not connected to a particular bus can pass through holes in the sheet bus conductors. This is made possible, of course, by making the openings in the other buses sufficiently large that the conductor with insulation around it can pass through. As is seen in FIG. 11 conductor 214 passes through the enlarged opening in control bus sheet 206 and a similar opening in the positive bus sheet 204 before reaching and being attached to negative bus 202. Conductor 212 passes through the control bias sheet 206, through an enlarged opening and is connected to positive bus 204 but extends no further.

Both the positive cable 216 and negative cable 218 pass through enlarged openings in all three bus sheets so that they present terminals which extend beyond the bus module in order for cables to be attached to cable terminals 220 or 222. The opposite side of the power bus backplane has terminals for connection to modules so that in this embodiment, the cables terminate in pins 212a, 214a, 216a and 218a corresponding to the conductors described. Additionally, a conductor terminal 224 is also provided having connection to the control bus 206.

In FIGS. 9 and 10, the bus panel modules 200 are divided into an upper module 200a and lower module 200b. The upper panel has five columns and three rows of identical terminals and the lower panel has five columns of two rows of identical terminals. Since the terminals are of identical configuration, conforming modules can be conveniently coupled to any representative group column.

A single cooperating module 226 is shown in FIG. 10. In this case the tulip connectors are shown as supported on the module. These are given similar number designators as the terminals to which they connect but with a "b" suffix. Since the modules have the tulip connectors, the power bus backplane 200 provides pin connectors. The opposite arrangement will also work, of course.

FIG. 10 and FIG. 13 differ in some detail in the structure and also in that there is no control bus in FIG. 13 and thus no terminal end connector. Despite the differences which occur, the similarities are such that similar parts have been given similar number designators.

The modules in this embodiment differ from the modules in the earlier embodiment in that the module is connected along a long narrow edge and all of the connectors are in a single row. The connectors could be placed in a different pattern than a single row, particularly in those embodiments where the bus bars are sheets of copper or other conductive material. However, this arrangement lends to uniformity and the modules still can be rectangular solid boxes the contents of which are prepared in advance to produce desired functions in accordance with the design of the functional module. By placing the broad faces and the top and bottom edges of the modules against one another, additional support is provided in the same way it is provided in the previously described configurations.

It will be noted that this arrangement effectively supplies two power bus sheets or bars so that the bus backplane is capable of handling one phase of AC. If instead of sheets, different bus bars are provided in parallel rows behind the columns of connectors, adjacent columns could be used to supply a different one of three phases. Also using the configuration of FIG. 9, the five columns of bus bars could supply three phase AC and DC. The same load terminals can be used as input terminals to place power on the bus bars or sheets using one module. Power may be taken from the bus bars in another module or as many others as the power bus backplane permits.

Examples of the simplest types of circuitry serve to illustrate how the modules function with the power bus backplanes of FIGS. 9–16.

Figure 14:
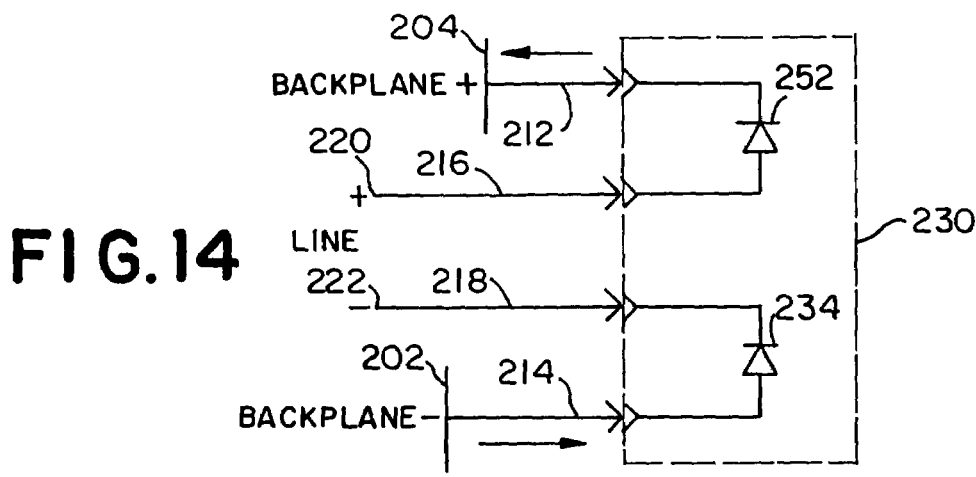
FIG. 14 is a diagrammatic view showing how a functional module can connect the power lines to the backplane and provide isolation of the backplane buses from feed back to the power lines.

FIG. 14 represents the conductors and connectors shown, for example, in FIG. 13. In this case, the power line input is applied to terminals 220 and 222 and the power thus applied is fed to module 230. Module 230 has within it a pair of diodes 232 and 234. The diodes are connected to the positive and negative power lines as shown so that flow in the direction of the arrows can proceed to the bus bars 204 and 202, respectively, through the lines in the terminals 212 and 214 respectively. Thus the module is responsible for putting power on the respective bus sheets 202 and 204 and the diodes function to block reverse flow from the backplane toward the power source.

Figure 15:
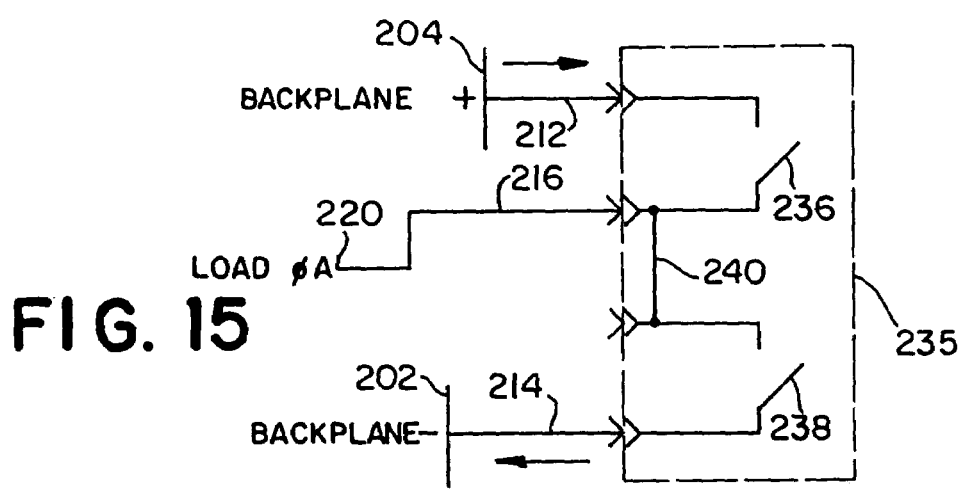
FIG. 15 is a schematic diagram showing how one phase of three phase AC taken from the backplane buses can be inverted by a functional module.

FIG. 15 shows the backplane as a source of current. Flow will be in the direction of arrow along conductor 212 and through the switch 236 when the switch is closed. Power will flow in one direction provided switch 238 is not closed. When switch 238 is closed and switch 236 is open, power will flow through a cross connection 240 in the module into conductor 216 to reach output terminal 220 feeding phase A of the load. If a single phase is used, the other terminal of the load may be grounded to get phase A of the three phase power. If all three phases are used individual modules will produce an output at the corresponding terminal of phases B and C and their outputs can be connected in an appropriate three phase connection.

Figure 16:
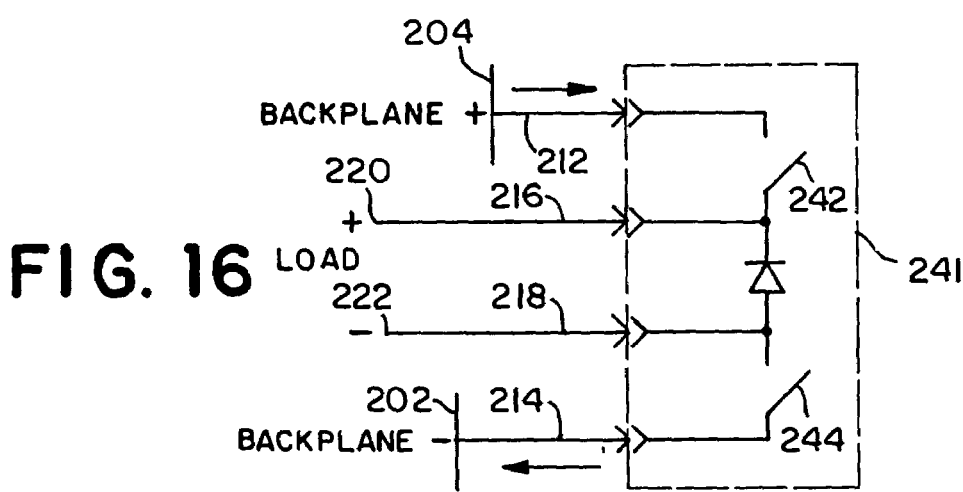
FIG. 16 shows how a DC load can be switched by a functional module, offering the possibility for DC regulation and DC conversion as well.

FIG. 16 employs a module which again employs two switches 242 and 244. The switches respectively allow power to flow from the positive backplane sheet bus 204 through the line 212 to switch 242 to line 216, to the terminal 220 which is connected to the positive load terminal. Negative backplane sheet bus 202 produces an opposite flow through line 214, switch 244 and output line 218 to terminal 222 which is connected to the negative terminal of the load.

The following is claimed:

1. An electrical modular power node comprising:
   a. a power bus backplane containing a plurality of bus bars at least some of which are connectable to at least one power source, each bus bar having a plurality of terminals at regular intervals along the bus bar, each terminal being in a standard position in a pattern with terminals from the other bus bars and al terminal patterns being in a standard orientation on the backplane; and
   b. a plurality of functional modules, each housing circuitry having at least one connector for a connection to at least one terminal on a bus bar and including bounding faces conforming to bounding faces of adjacent modules when also connected to the backplane, said modules providing geometrical packages for enclosing and supporting functional components, circuitry and connectors for electrically connecting the functional components and circuitry to the appropriate terminals, the connectors facing the power bus backplane being positioned to connect with specific terminals within each pattern on the bus bars such that each pattern of terminals on the backplane will accept minimum dimension modules at each terminal position without interfering with other module at other terminal positions.

2. The electrical modular power node of claim 1 in which connections between each functional module and selected terminals of the bus bars on the backplane contribute to support of said modules in position relative to the power backplane and other modules.

3. The electrical modular power node of claim 2 in which the functional modules are self-connecting to the backplane, such that when a functional module is properly positioned and oriented relative to the backplane and pressed towards the backplane, the terminals and connectors self-engage and make electrical contact.

4. The electrical modular power node of claim 1 in which parallel sets of bus bars are provided in the backplane and the functional modules are shaped and sized so that faces of the functional modules conform to bounding faces of adjacent functional modules.

5. The electrical modular power node of claim 4 wherein some modules are not to be electrically connected to given bus bars and connectors are provided on the modules in proper position for such connection which resemble those providing electrical connection, but in those positions only function to provide additional mechanical support for the module.

6. The power modular power node of claim 4 in which connections between the connections between the connectors supported on each functional module and selected terminals of the bus bars of the backplane support said functional modules in position relative to the power backplane and relative to other functional modules.

7. The electrical modular power node of claim 5 in which the connectors on the functional modules are self-connecting to terminals on the backplane such that when a functional module is properly positioned and oriented relative to the backplane and pressed toward the backplane, the terminals and connectors self-engage providing mechanical support for the module and making electrical connection where intended.

8. The electrical modular power node of claim 4 in which at leas some of the bus bars in the same relative positions within the parallel sets of bus bars are electrically connected together.

9. The electrical modular power node of claim 8 in which at least one set of interconnected bars is connected to a power source.

10. The electrical modular power node of claim 4 in which at least one set of bus bars of the parallel sets of bus bars are not electrically connected together and not connected to an external power source but at least one set of bus bars is connectable to an external power source.

11. The electrical modular power node of claim 3 in which at each minimum size functional module position on the backplane there is a terminal for each bus bar in a standard pattern of configuration and orientation whereby connectors on modules in positions opposite selected terminals self-engage those terminals in the power bus backplane and contribute to support of the functional module and terminals which are not opposed by connectors are accommodated by the module configuration to permit interconnection of those terminals and connectors which are opposed to one another.

12. The electrical modular power node of claim 3 in which at each minimum size functional module position on the backplane there is a terminal for each bus bar in a standard pattern of configuration and orientation whereby terminals in positions opposite selected connectors engage those connectors in the power module to self-engage and contribute to support of the functional module and connectors which are not opposed by connectors are accommodated by the module configuration to permit interconnection of those terminals and connectors which are opposed to one another.

13. The electrical modular power node of claim 3 in which those connectors opposite terminals which are not to be connected electrically in the functional module are not electrically connected in the module but provide mechanical support.

14. The electrical modular power node of claim 11 in which the terminals on the bus bars of the backplane are a post and the connectors on the functional modules are spring-loaded gripping elements which yield to a post but continue to engage that post as a module is moved toward the backplane.

15. The electrical modular power node of claim 10 in which the terminals on the bus bars of the backplane are spring-loaded gripping elements and the connectors on the functional modules are a simple post, whereby the gripping elements yield to a post but continue to engage that post as the functional module is moved toward the backplane.

16. An electrical modular power node of claim 3 in which the backplane of the power module is marked to indicate proper positioning of functional modules of minimum size whereby functional modules placed in the positions indicated but spaced away from the backplane may be guided toward the indicated backplane positions for self-engaging connection of the connectors to the terminals.

17. An electrical modular power node of claim 4 in which the backplane is marked to indicate proper positioning of functional modules of minimum size whereby functional modules placed in the positions indicated but spaced away from the backplane may be moved towards the backplane for self-engaging connection of the connectors to the terminals.

18. The electrical modular power node of claim 4 in which the backplane is marked to indicate proper positioning of functional modules of minimum size whereby functional modules placed in the positions indicated but spaced away from the backplane may be moved toward the backplane for self-engaging connections of the connectors to the terminals, wherein functional modules having dimensions which have a dimension an integral multiple of the minimum size may also be accommodated by providing at least one set of connectors on the functional module in the pattern orientation corresponding to at least part of one pattern and orientation of terminals on the backplane and wherein other terminals at other positions on the backplane are accommodated by design of the module.

19. The electrical modular power node of claim 18 in which all positions on the larger than minimum size functional module which correspond to the terminal positions on the backplane are provided with electrical connectors or non-electrical connectors which engage all of the terminals on the backplane opposite the larger module and, therefore, further contribute to its support.

20. The electrical power node of claim 4 in which at least some functional modules are directly electrically interconnected through connections on opposed functional modules faces other than those facing the backplane.

21. The electrical power node of claim 9 in which at least some functional modules are directly electrically interconnected through connections on opposed module faces other than those facing the backplane.

22. The electrical power node of claim 21 in which connectors are supported on a sidewall face of a functional module and terminals positioned to mate with the connectors are positioned on an opposed sidewall face of another functional module.

23. The electrical power node of claim 22 in which the respective connectors are self-connecting and in predetermined patterns, orientation and position on the sidewalls so that when the sidewalls are moved together with the modules in predetermined position the connections self-connect, electrically connecting active electrical connections and their respective circuitry together.

24. The electrical power node of claim 21 which the respective connectors are supported on opposed faces parallel to the backplane of functional modules enabling the functional modules to be stacked away from the backplane so that the outer module is supported on the inner module at least in part by engagement of their respective electrical terminals and connectors.

25. The electrical modular power node of claim 1 in which the terminals are so rigidly supported on the backplane and the connectors so firmly supported on the module housings that when the connector and terminals are engaged they provide mechanical support for the module.

26. In an electrical modular power node including a power bus backplane containing a plurality of bus bars at least some of which are connectable to at least one power source, each bus bar having terminals spaced along the bus bar, each terminal being in a predetermined position in a pattern, and a plurality of functional modules, each housing at least one functional component and circuitry having at least one connector for connection to at least one terminal on a bus bar to provide output required by a load, the improvement characterized by
   a. respective ones of the bus bars running in a first direction and being adapted to carry differing phases and/or polarities of power with plural ones of said bars carrying individual phases and/or polarities being connected together by tie bars extending generally transversely to said first direction, with the bus bars and tie bars of respective phases/polarities being generally coplanar and perpendicularly spaced from one another.

27. The electrical modular power node of claim 26 in which connections between functional modules and terminals of the bus bars results in vertical and lateral support of other modules in facing position relative to the power backplane and other modules.

28. The electrical modular power node of claim 27 in which the functional modules are self-connecting to the backplane, such that when a functional module is properly positioned and oriented relative to the backplane and pressed towards the backplane, the terminals and connectors mechanically self-engage and make electrical contact and the backplane vertically supports the functional module via the connection.

29. The electrical modular power node of claim 26 in which parallel sets of bus bars are provided in the backplane and the functional modules are shaped and sized so that exterior surfaces of the functional modules facingly conform to bounding exterior surfaces of adjacent functional modules.

30. The electrical modular power node of claim 29 having module positions where some terminals on the bus bar not to be electrically connected to a given functional module are provided which resemble those providing electrical connection and in those positions provide additional mechanical support.

31. The electrical modular power node of claim 29 in which connectors supported on each functional module and selected terminals of the bus bars of the backplane support said functional modules in position relative to the power backplane and relative to other functional modules.

32. The electrical modular power node of claim 30 in which pin connectors on the functional modules are self-connecting to tulip terminals on the backplane such that when a functional module is properly positioned and oriented relative to the backplane and pressed toward the backplane, the terminals and connectors self-engage making electrical contact.

33. The electrical modular power node of claim 29 in which at least some bars in the same relative positions of the parallel sets of bus bars are electrically connected together.

34. The electrical modular power node of claim 33 in which at least one set of interconnected bars is connected to a power source.

35. The electrical modular power node of claim 29 in which at least some bus bars in the same relative positions of the parallel sets of bus bars are not electrically connected together and not connected to an external power source.

36. The electrical modular power node of claim 28 in which at each minimum size functional module position on the backplane there is a terminal for each bus bar in a standard pattern of configuration and orientation whereby connectors in positions opposite selected terminals engaging those terminals contribute to support of the functional module and terminals which are not opposed by connectors are accommodated by the module configuration to permit interconnection of those terminals and connectors which are opposed to one another.

37. The electrical modular power node of claim 28 in which at each minimum size functional module position on the backplane there is a terminal for each bus bar in a standard pattern of configuration and orientation whereby terminals in positions opposite selected connectors self-engage and contribute to support of the functional module and connectors which are not opposed by connectors are accommodated by the module configuration to permit interconnection of those terminals by the module configuration to permit interconnection of those terminals and connectors which are opposed to one another.

38. The electric modular power node of claim 28 in which those positions opposite terminals which are not to be connected electrically to a functional module are opposed by connectors not electrically connected in the module providing mechanical support.

39. The electrical modular power node of claim 35 in which the terminals on the bus bars of the backplane are spring-loaded gripping elements and the connectors on the functional modules are a simple post, whereby the gripping elements yield to a post but continue to engage that post as the functional module is moved toward the backplane.

40. An electrical modular power node of claim 28 in which the backplane is marked to indicate proper positioning of functional modules of minimum size whereby functional modules placed in the positions indicated by spaced away from the backplane may be moved toward the backplane for self-engaging connection of the connectors to the terminals.

41. An electrical modular power node of claim 29 in which the backplane is marked to indicate proper positioning of functional modules of minimum size whereby functional modules placed in the positions indicated but spaced away from the backplane may be moved towards the backplane for self-engaging connection of the connectors to the terminals.

42. The electrical modular power node of claim 29 in which the backplane is marked to indicate proper positioning of functional modules of minimum size whereby functional modules placed in the positions indicated but spaced away from the backplane may be moved toward the backplane for self-engaging connection of the connectors to the terminals, wherein functional modules having a dimension which is an integral multiple of the minimum size may also be accommodated by providing at least one set of connectors on the functional module in a pattern and orientation corresponding to a least part of one pattern and orientation of terminals on the backplane and wherein other terminals at other positions on the backplane are accommodated by design of the module.

43. The electrical modular power node of claim 18 in which all positions on the larger than minimum size functional module which correspond to the terminal positions on the backplane are provided with electrical connectors or non-electrical connectors which engage all of the terminals on the backplane opposite the larger module and contribute to its support.

44. The electrical power node of claim 29 in which at least some functional modules are directly electrically interconnected through connections on opposed functional module faces other than those facing the backplane.

45. The electrical power node of claim 34 in which at least some functional modules are directly electrically interconnected through connections on opposed module faces other than those facing the backplane.

46. The electrical power node of claim 21 in which connectors are supported on a sidewall face of a functional module and terminals positioned to mate with the connectors are positioned on an opposed sidewall face of another functional module.

47. The electrical power node of claim 22 in which the respective connectors are self-connecting and in predetermined patterns, orientation and position on the sidewalls so that when the sidewalls are moved together with the modules in predetermined position the connections self-connect, electrically connecting active electrical connections and their respective circuitry together.

48. The electrical power node of claim 21 in which the respective connectors are supported on opposed faces parallel to the backplane of functional modules enabling the functional modules to be stacked away from the backplane so that an outer module is supported on an inner module at least in part of engagement of their respective electrical terminals and connectors.

49. A modular electrical power node comprising:
   a. a plurality of functional modules each contained in a housing adapted for complemental joining with other ones of said functional modules and with a power bus backplane, at least some of said functional modules comprising at least one of rectifying means, voltage regulation means, pulse and other wave form generation means, voltage transformation means and/or power sensing and limiting means, at least of some of said functional modules further comprising:
      i. circuitry and at least one component for modifying power passing between the module and the backplane, connecting to terminals affixed to and capable of supporting the module to some extent through electrical and mechanical plug-compatible connection to terminals on said backplane;
   b. a control module contained in a housing adapted for complemental joining with at least one of said functional modules and with said backplane, comprising:
      i. programmable microprocessor means for controlling operation of at least one of said functional modules according to preselected instructions and operating and performance criteria including at least one of voltage and current limits, voltage polarity, surge criteria, temperature limits, humidity limits, shock limits and alternating current phase parameters;
   c. the power bus backplane having a plurality of bus bars, at least some of which are connectable to at least one power source, each bus bar having terminals spaced along the bus bar in predetermined positions in a pattern, with respective ones of the bus bars running in a first direction and being adapted to carry differing phases and/or polarities of power with plural ones of said bars carrying individual phases and/or polarities being connected together by tie bars extending generally transversely to said first direction, with the bus bars and tie bars of respective phases/polarities being generally coplanar and perpendicularly spaced from one another with said plural connected bus bars being grouped in sets, each set embracing at least two bus bars and being adapted to carry power having phase and/or polarity differing from power carried by other sets, said sets being transversely spaced one from another, with bus connectors of each set being connected together by ties extending transversely to the first direction, bus conductors of each set being laterally spaced from one another in a second direction transversely to said first direction, the sets being transversely spaced one from another in a third direction perpendicular to the first and second direction so that the bus conductors and the ties of respective sets carrying respective individual phases and/or polarities are co-planar and perpendicularly spaced from one another; and
   d. plug-compatible means on said backplane and at least one of said modules for electrically connecting said module to at least some of said bus bars of said backplane.

50. The node of claim 49 wherein said functional module housings are parallelepiped-shaped.

51. The node of claim 49 wherein said control module housing is parallelepiped-shaped.

52. The node of claim 50 wherein said control module housing is parallelepiped-shaped.

53. The node of claim 49 wherein said functional module housings are adapted for complementally contacting other ones of said functional modules.

54. The node of claim 49 wherein said functional module housings are adapted for complementally contacting said backplane.

55. The node of claim 53 wherein said functional module housings are adapted for complementally contacting said backplane.

56. The node of claim 49 wherein said control module housing is adapted for complementally contacting housings of said functional modules.

57. The node of claim 49 wherein said control module housing is adapted for complementally contacting said backplane.

58. The node of claim 56 wherein said control module housing is adapted for complementally contacting said backplane.

59. The node of claim 49 wherein said plug-compatible means include a plurality of spring-loaded receptacles connected to respective sets of said bus bars and are adapted to receive connector pins extending from functional module surfaces facing said backplane.

60. The node of claim 49 further comprising resinous material cast about the bus conductors to support the bus conductors and the associated backplane terminals.

61. The node of claim 49 in which the bus conductors are in a stacked array and terminals for a bus conductor on the bottom pass through a clearance hole in the bus conductor on the top with an insulating gap therebetween.

62. The node of claim 49 in which the bus conductors are repeatedly in a side-by-side orientation resulting in columns of stacked bus conductors with regular columns of terminals for receiving modules at regular intervals along the column.

* * * * *